United States Patent [19]

Betts

[11] 4,125,900
[45] Nov. 14, 1978

[54] CASCADED RECURSIVE DIGITAL FILTER

[75] Inventor: William L. Betts, St. Petersburg, Fla.

[73] Assignee: NCR Corporation, Dayton, Ohio

[21] Appl. No.: 812,082

[22] Filed: Jul. 1, 1977

[51] Int. Cl.² .................. G06F 7/38; G06F 15/34
[52] U.S. Cl. .................................................. 364/724
[58] Field of Search ........................................ 364/724

[56] References Cited

U.S. PATENT DOCUMENTS

| 3,703,632 | 11/1972 | Shanks .................. | 364/724 |
| 3,777,130 | 12/1973 | Crorsier et al. .......... | 364/724 |
| 4,021,654 | 5/1977 | Harris et al. ............ | 364/724 |

Primary Examiner—David H. Malzahn
Attorney, Agent, or Firm—J. T. Cavender; Edward Dugas

[57] ABSTRACT

A cascaded digital recursive filter is designed to filter a time varying digital input signal by repetitively implementing a sequence of filtering equations which include a predetermined number of filter coefficients to generate a filtered digital output signal. The filter includes a clock for generating a series of timing pulses. A coefficient selection means is responsive to the timing pulses and generates a pulse grouping signal. The pulse grouping signal groups the timing pulses into repetitive trains of individually numbered pulses. The coefficient selection means also generates a repetitive series of stored filter coefficients, each of which is associated with an individually numbered pulse in each train. The output of the coefficient selection means is transferred to a coefficient output line. A variable store means is responsive to the timing pulses and to the pulse grouping signal for selectively storing variables generated by a processor means and for generating a partially repetitive series of variables on a variable output line. The processor means is coupled to the coefficient output line of the coefficient selection means and to the variable output line of the variable store means and responds to the digital input signal and to the pulse grouping signal to combine selected stored filter coefficients, selected variables and the digital input signal to generate a filtered digital output pulse at the end of each train of numbered pulses.

10 Claims, 7 Drawing Figures

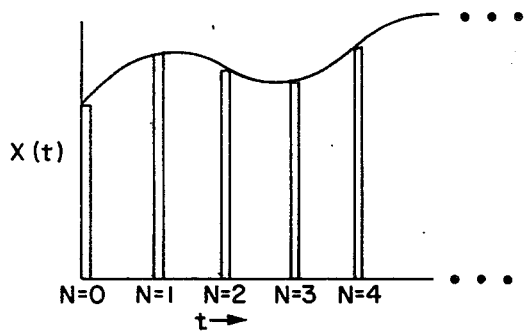

FIG-1
TIME SAMPLED INPUT SIGNAL

| INPUT SIGNAL | OUTPUT SIGNAL |
|---|---|
| X(1) → | Y(6,1) |
| X(2) → | Y(6,2) |
| X(3) → | Y(6,3) |
| ⋮ | ⋮ |

FIG-4

① FS1 OUTPUT $\quad Y(1,N) = A(1,0)X(N)+A(1,1)X(N-1)+A(1,2)X(N-2)-B(1,1)Y(1,N-1)-B(1,2)Y(1,N-2)$ ② FS2 OUTPUT $\quad Y(2,N) = A(2,0)Y(1,N)+A(2,1)Y(1,N-1)+A(2,2)Y(1,N-2)-B(2,1)Y(2,N-1)-B(2,2)Y(2,N-2)$ ③ FS3 OUTPUT $\quad Y(3,N) = A(3,0)Y(2,N)+A(3,1)Y(2,N-1)+A(3,2)Y(2,N-2)-B(3,1)Y(3,N-1)-B(3,2)Y(3,N-2)$ ④ FS4 OUTPUT $\quad Y(4,N) = A(4,0)Y(3,N)+\ldots$ ⑤ FS5 OUTPUT $\quad Y(5,N) = A(5,0)Y(4,N)+\ldots$ ⑥ FS6 OUTPUT & FILTER OUTPUT $\quad Y(6,N) = A(6,0)Y(5,N)+A(6,1)Y(5,N-1)+A(6,2)Y(5,N-2)-B(6,1)Y(6,N-1)-B(6,2)Y(6,N-2)$

FIG-2
DIFFERENCE EQUATIONS FOR A SIX STAGE
SECOND ORDER DIGITAL FILTER

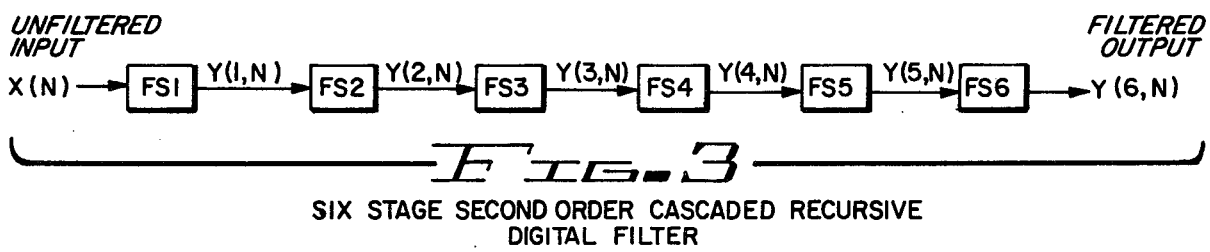

FIG-3
SIX STAGE SECOND ORDER CASCADED RECURSIVE
DIGITAL FILTER $X(3) \rightarrow \boxed{A(1,0)X(3)+A(1,1)X(2)+A(1,2)X(1)-B(1,1)Y(1,2)-B(1,2)Y(1,1)} \rightarrow Y(1,3)$

FIG-5

RAM IMPLEMENTATION OF CASCADED RECURSIVE DIGITAL FILTER

| DIFFERENCE EQUATION BEING IMPLEMENTED | COEFFICIENT ADDRESS | ROM CONTENTS | SEQUENCE N=3 | | | | SEQUENCE N=4 | | | | SEQUENCE N=5 | | | |
|---|---|---|---|---|---|---|---|---|---|---|---|---|---|---|
| | | | SEQUENCE COUNT | INDEX | RAM ADDRESS | RAM CONTENTS | SEQUENCE COUNT | INDEX | RAM ADDRESS | RAM CONTENTS | SEQUENCE COUNT | INDEX | RAM ADDRESS | RAM CONTENTS |
| 1 | 0 | A(1,0) | 0 | 0 | 0 | X(3) | 0 | 15 | 15 | X(4) | 0 | 14 | 14 | X(5) |
| | 1 | A(1,1) | 1 | 0 | 1 | X(2) | 1 | 15 | 0 | X(3) | 1 | 14 | 15 | X(4) |
| | 2 | A(1,2) | 2 | 0 | 2 | X(1) | 2 | 15 | 1 | X(2) | 2 | 14 | 0 | X(3) |
| | 3 | B(1,1) | 3 | 0 | 3 | Y(1,2) | 3 | 15 | 2 | Y(1,3) | 3 | 14 | 1 | Y(1,4) |
| | 4 | B(1,2) | 4 | 0 | 4 | Y(1,1) | 4 | 15 | 3 | Y(1,2) | 4 | 14 | 2 | Y(1,3) |
| 2 | 5 | A(2,0) | 0 | 2 | 2 | Y(1,3) | 0 | 1 | 1 | Y(1,4) | 0 | 0 | 0 | Y(1,5) |
| | 6 | A(2,1) | 1 | 2 | 3 | Y(1,2) | 1 | 1 | 2 | Y(1,3) | 1 | 0 | 1 | Y(1,4) |
| | 7 | A(2,2) | 2 | 2 | 4 | Y(1,1) | 2 | 1 | 3 | Y(1,2) | 2 | 0 | 2 | Y(1,3) |
| | 8 | B(2,1) | 3 | 2 | 5 | Y(2,2) | 3 | 1 | 4 | Y(2,3) | 3 | 0 | 3 | Y(2,4) |
| | 9 | B(2,2) | 4 | 2 | 6 | Y(2,1) | 4 | 1 | 5 | Y(2,2) | 4 | 0 | 4 | Y(2,3) |
| 3 | 10 | A(3,0) | 0 | 4 | 4 | Y(2,3) | 0 | 3 | 3 | Y(2,4) | 0 | 2 | 2 | Y(2,5) |
| | 11 | A(3,1) | 1 | 4 | 5 | Y(2,2) | 1 | 3 | 4 | Y(2,3) | 1 | 2 | 3 | Y(2,4) |
| | 12 | A(3,2) | 2 | 4 | 6 | Y(2,1) | 2 | 3 | 5 | Y(2,2) | 2 | 2 | 4 | Y(2,3) |
| | 13 | B(3,1) | 3 | 4 | 7 | Y(3,2) | 3 | 3 | 6 | Y(3,3) | 3 | 2 | 5 | Y(3,4) |
| | 14 | B(3,2) | 4 | 4 | 8 | Y(3,1) | 4 | 3 | 7 | Y(3,2) | 4 | 2 | 6 | Y(3,3) |
| 4 | 15 | A(4,0) | 0 | 6 | 6 | Y(3,3) | 0 | 5 | 5 | Y(3,4) | 0 | 4 | 4 | Y(3,5) |
| | 16 | A(4,1) | 1 | 6 | 7 | Y(3,2) | 1 | 5 | 6 | Y(3,3) | 1 | 4 | 5 | Y(3,4) |
| | 17 | A(4,2) | 2 | 6 | 8 | Y(3,1) | 2 | 5 | 7 | Y(3,2) | 2 | 4 | 6 | Y(3,3) |
| | 18 | B(4,1) | 3 | 6 | 9 | Y(4,2) | 3 | 5 | 8 | Y(4,3) | 3 | 4 | 7 | Y(4,4) |
| | 19 | B(4,2) | 4 | 6 | 10 | Y(4,1) | 4 | 5 | 9 | Y(4,2) | 4 | 4 | 8 | Y(4,3) |
| 5 | 20 | A(5,0) | 0 | 8 | 8 | Y(4,3) | 0 | 7 | 7 | Y(4,4) | 0 | 6 | 6 | Y(4,5) |
| | 21 | A(5,1) | 1 | 8 | 9 | Y(4,2) | 1 | 7 | 8 | Y(4,3) | 1 | 6 | 7 | Y(4,4) |
| | 22 | A(5,2) | 2 | 8 | 10 | Y(4,1) | 2 | 7 | 9 | Y(4,2) | 2 | 6 | 8 | Y(4,3) |
| | 23 | B(5,1) | 3 | 8 | 11 | Y(5,2) | 3 | 7 | 10 | Y(5,3) | 3 | 6 | 9 | Y(5,4) |
| | 24 | B(5,2) | 4 | 8 | 12 | Y(5,1) | 4 | 7 | 11 | Y(5,2) | 4 | 6 | 10 | Y(5,3) |
| 6 | 25 | A(6,0) | 0 | 10 | 10 | Y(5,3) | 0 | 9 | 9 | Y(5,4) | 0 | 8 | 8 | Y(5,5) |
| | 26 | A(6,1) | 1 | 10 | 11 | Y(5,2) | 1 | 9 | 10 | Y(5,3) | 1 | 8 | 9 | Y(5,4) |
| | 27 | A(6,2) | 2 | 10 | 12 | Y(5,1) | 2 | 9 | 11 | Y(5,2) | 2 | 8 | 10 | Y(5,3) |
| | 28 | B(6,1) | 3 | 10 | 13 | Y(6,2) | 3 | 9 | 12 | Y(6,3) | 3 | 8 | 11 | Y(6,4) |
| | 29 | B(6,2) | 4 | 10 | 14 | Y(6,1) | 4 | 9 | 13 | Y(6,2) | 4 | 8 | 12 | Y(6,3) |
| | 30 | 0 | 0 | 12 | 12 | Y(6,3) | 0 | 11 | 11 | Y(6,4) | 0 | 10 | 10 | Y(6,5) |

FIG-7

CASCADED RECURSIVE DIGITAL FILTER

BACKGROUND OF THE INVENTION

1. Field of the Invention

This invention relates to cascaded filters, and more particularly, to cascaded recursive digital filters.

2. Description of the Prior Art

A cascaded recursive digital filter is a device which may be used to filter or otherwise condition digital signals. The filtered digital output pulses from the filter are further processed by other equipment to extract the desired information.

It has frequently been impractical to implement digital recursive filters due to the substantial memory storage and multiplier requirements. Previous attempts to fabricate cascaded digital recursive filters have resulted in quite expensive filter structures of large physical size. Attempts have been made to economize on memory and multiplier structures, however substantial time penalties have resulted from the reduction in hardware.

SUMMARY OF THE INVENTION

It is therefore a primary object of the present invention to provide a cascaded recursive digital filter which requires a single multiplier and two relatively small memory devices.

Another object of the present invention is to provide a cascaded recursive digital filter which utilizes a single accumulator register to store the intermediate computational results of the filter.

Yet another object of the present invention is to provide a cascaded recursive digital filter which utilizes a single read only memory to store all repetitive filter coefficients.

Still another object of the present invention is to provide a cascaded recursive digital filter which includes an address counter to generate a pulse grouping signal to group timing pulses into repetitive trains of individually numbered pulses.

Briefly stated, and in accord with one embodiment of the invention, a cascaded digital recursive filter filters a time varying input signal by repetitively implementing a sequence of filtering equations which include a predetermined number of filter coefficients to generate a filtered digital output signal consisting of a series of filtered digital output pulses. A timing means generates a series of timing pulses. A coefficient selection means is responsive to the timing pulses for generating a pulse grouping signal to group the timing pulses into repetitive trains of individually numbered pulses. The coefficient selection means also reads out a repetitive series of stored filter coefficients, each of which corresponds to an individually numbered pulse in each train. The output of the coefficient selection means is generated on a coefficient output line.

A variable store means is responsive to the timing pulses and to the pulse grouping signal for selectively storing variables generated by a processor means and for generating a partially repetitive series of variables on a variable output line.

The processor means is coupled to the coefficient output line of the coefficient selection means and also to the variable output line of the variable store means. The processor means is responsive to the digital input signal and to the pulse grouping signal for combining selected stored filter coefficients, selected stored variables and the digital input signal to generate a filtered digital output pulse at the end of each pulse train of individually numbered pulses.

DESCRIPTION OF THE DRAWING

The invention is pointed out with particularity in the appended claims. However, other objects and advantages, together with the operation of the invention, may be better understood by reference to the following detailed description taken in connection with the following illustrations wherein:

FIG. 1 is a graphic representation of a sampled, time varying input signal.

FIG. 2 is a listing of the six difference equations required to implement a six stage, second order cascaded recursive digital filter.

FIG. 3 is a schematic representation of a six stage, second order cascaded recursive digital filter.

FIG. 4 is a table illustrating sampled values of the analog input signal and corresponding filtered digital output pulses.

FIG. 6 is a block diagram of the preferred embodiment of the cascaded recursive digital filter.

FIG. 7 is a table illustrating the data content of various elements of the cascaded recursive digital filter shown in FIG. 6.

DESCRIPTION OF THE PREFERRED EMBODIMENT

Figure 5:
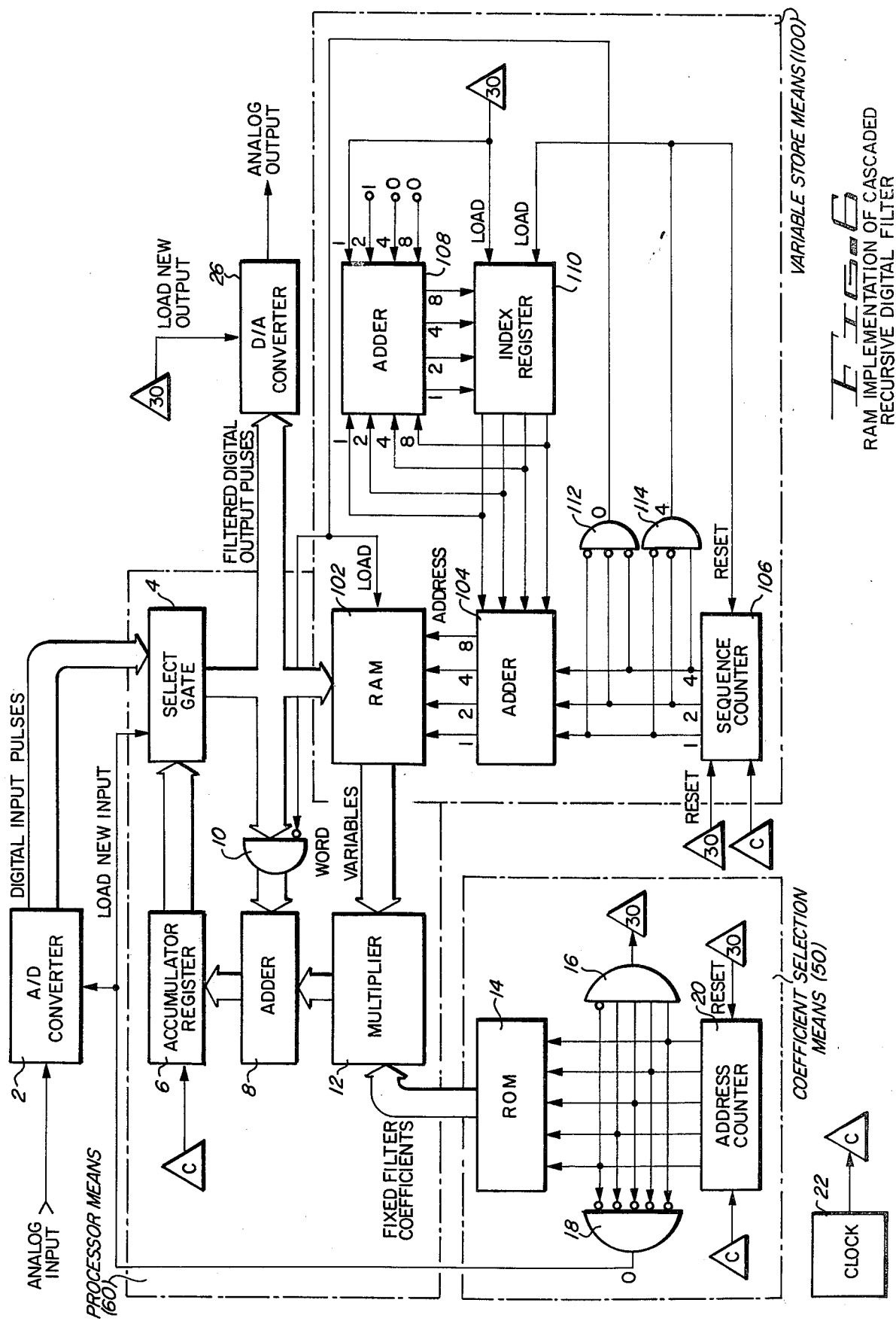
FIG. 5 is a schematic representation of the difference equation executed on the input signal by the first filter section of the cascaded recursive digital filter.

In order to better illustrate the advantages of the invention and its contributions to the art, a preferred hardware embodiment of the invention will now be described in some detail.

Referring now to FIG. 1, $X(t)$ is a time varying analog input signal containing noise which must be filtered from the signal. The $X(t)$ function is time sampled at sample intervals $N = 0, 1, 2, \ldots$. During the time interval between two consecutive samples, the digital filter of the present invention completes a processing operation and generates a filtered digital output pulse. Immediately upon generation of the filtered output pulse, the filter accepts the next subsequent sample of input signal $X(t)$ for processing. The preferred embodiment of the digital filter as set forth below is a cascade of six second order digital filters. The order and length of the filter can either be decreased or increased in relation to the amount of filtering desired.

A cascaded recursive digital filter is implemented by means of difference equations. The difference equations required for implementing a six stage second order digital filter are set forth in FIG. 2. The parameters for these six equations are defined as follows:

$Y(i,N)$ is the output of filter section $i$ at time interval $N$ $A(i,j)$ is the input weighting coefficient number $j$ for the filter section number $i$ $X(N)$ is the input sample at time interval $N$ $X(N-1)$ is the input sample at time interval $(N-1)$ The notation $(N-j)$ refers to the $j^{th}$ past sample of the respective value $B(i,j)$ is the output weighting coefficient number $j$ for filter section number $i$ $Y(i,N-j)$ is the $j^{th}$ past output from filter section $i$.

FIG. 3 is a schematic representation of the manner in which the six second order difference equations set forth in FIG. 2 are implemented. $X(N)$ represents the $N^{th}$ time sampled unfiltered digital input pulse while Y(6,N) represents the filtered digital output pulse derived from X(N). Filter sections 1–6 are represented by the abbreviations FS1–FS6. The partially filtered output pulses from each of the filter sections FS1–FS5 are represented by the functions Y(1,N), Y(2,N), Y(3,N), Y(4,N), and Y(5,N).

Filter section FS1 must completely process the digital input pulse X(N) prior to generating its output pulse Y(1,N). Each of the subsequent filter sections sequentially generates an output pulse which becomes the input pulse to the adjacent filter section. Filtered output pulse Y(6,N) is generated before the filter accepts the next sampled input pulse, X(N+1).

In each difference equation in FIG. 2 the "A" filter coefficients weight the current input pulse and the two previous input pulses to each filter section. The "B" coefficients are used to weight the past output pulses from each filter section.

In a six stage digital filter, all six filter equations must be solved once during each sampling period. As an example, voice signals can be sampled, filtered, and converted back to an analog output signal with reasonable quality at an eight kHz sampling rate. For an eight kHz sampling rate the sampling period is 125 microseconds. For a six stage digital filter, the six difference equations set forth in FIG. 2 must each be solved once within the 125 microsecond sampling period. As the preferred embodiment of this digital filter time shares a single high speed multiplier and accumulator, the multiplier must operate at a rate substantially faster than the sampling rate. Since each of the six difference equations must be solved once during each sampling interval and since each of the six equations requires five multiplication operations, the thirty multiplication operations present in these six equations must be completed within the 125 microsecond sampling interval. Therefore the time shared multiplier of the present invention must operate "30" times faster than the sampling rate which requires a clock rate of 240kHz.

A close inspection of the difference equations set forth in FIG. 2 indicates that certain terms reappear on a regular basis. For instance, in each difference equation the first variable term corresponds to the output of the preceding filter section. For example, the first term to the right of the equal sign in equation number 2 is Y(1,N) which is identical to the term to the left of the equal sign in equation 1. This relationship is true for all six difference equations.

The technique described for the present embodiment of a cascaded recursive digital filter facilitates recall of past digital input pulses and filter output pulses for reuse in subsequent filter sections without using redundant storage locations. Further inspection of the difference equations reveals that a term which in one sample period is the current input sample, will in the next sampling period be the past input sample.

FIG. 4 further clarifies the mathematical notation utilized for this discussion. The term X(1) represents the digital input sample of the time varying input function X(t) taken at sampling time N=1. The output signal function Y(6,1) indicates that the output pulse Y of the sixth filter section corresponds to the input sample taken at sampling time N=1.

FIG. 5 demonstrates on a more detailed level the correspondence between each individual filter section and its associated difference equation. In FIG. 5 a digital sample of the time varying input signal X(t) is taken at sampling time N=3. The various elements of difference equation 1 are contained within the block diagram representation of FS1. As can be seen, each variable (X or Y) is multiplied by one of "30" available constant filter coefficients [A(i,j) or B(i,j)]. The filtered output pulse from FS1 is indicated by Y(1,3). The "1" indicates that the filtered output pulse has been generated by the first filter section while the "3" indicates that the filtered output pulse has been derived from the time varying input function X(t) at a sample time N=3.

FIG. 6 illustrates the random access memory (RAM) implementation of a cascaded recursive digital filter. The preferred embodiment will be described in terms of a cascade of six second order digital filters to correspond to the six second order difference equations set forth in FIG. 2. The broad arrows between elements such as A/D converter 2 and select gate 4 depict the transfer of parallel "12" bit words.

Variable store means 100 includes RAM 102 which stores the variables, adder 104, sequence counter 106, adder 108, index register 110, and And gates 112 and 114 which address the variables stored in RAM 102. In the preferred embodiment a 16 word memory is used. The number of bits of accuracy required must be determined for each application, but typically "12" bits will be adequate. Three integrated circuits similar to the National DM-7489 can be used to implement RAM 102. The RAM requires only a "15" word capacity, but a "16" word capacity is the most readily commercially available product.

Clock 22 serves as a timing means for the entire filter. The letter "C" surrounded by a triangle represents the clock output line.

Five multiplication operations must be solved for each of the six difference equations shown in FIG. 2. A single multiplication operation will always involve the multiplication of a fixed filter coefficient "A" or "B" by an "X" or a "Y". Thus, each difference equation contains five fixed value filter coefficients and five variables. Sequence counter 106 is incremented once after each multiplication operation and sequences the address of RAM 102 through the stored variables in the order set forth in the difference equations. Since sequence counter 106 is incremented five times per difference equation, it has five output states (0, 1, 2, 3, 4). And gate 114 detects the count of "4" at the end of the counting sequence and resets sequence counter 106 while simultaneously advancing the count stored in the index register 110 by "2". The operation of index register 110 will be explained below. At the end of each sampling interval which consists of "31" clock pulses, adder 108 is activated to advance the index register 110 output by three counts.

Adder 104 adds the output count from index register 110 to the output count from sequence counter 106 to derive the address for RAM 102. All arithmetic is performed modulus "16", using adders such as the Texas Instruments 74283. Any overflow is discarded and causes the address of RAM 102 to go from a higher location to a lower location. Using modulus "16" arithmetic the addition of "3" to the numerical equivalent of "14" would yield an address of "1".

The table set forth in FIG. 7 shows the counting sequence and addressing sequence for RAM 102 through three sample periods or sequences where N=3, 4, and 5. The variable (X or Y) which is stored in each memory location in RAM 102 during each sample period is shown under the heading "RAM Contents". The sequence was started at sample time N=3 to eliminate the need to establish initial conditions for the filter.

Read only memory (ROM) 14 stores on a permanent basis each of the 30 fixed coefficients utilized in the six difference equations shown in FIG. 2. The first fixed filter coefficient "A" (1,0) in difference equation number "1" is stored in address "0" of ROM 14. In FIG. 7, the columns labeled "Coefficient Address" and "ROM Contents" illustrate the association between each of the six difference equations, the fixed filter coefficients and the associated address in ROM 14. The fixed filter coefficients will not change from sample period to sample period and are readily adapted to be stored in a ROM. The "B" filter coefficients which are subtracted in accordance with the six difference equations are stored with their negative values to simplify operations.

The time between consecutive samples of the input function X(t) is grouped into "31" separate time intervals, each of which corresponds to a single clock pulse. Each of the clock pulses in a single sequence of pulses taken during a single sampling interval is identified by a number. The first clock pulse occurring during a sampling interval is identified by the number "0" while the last or 31st clock pulse during a sampling interval is identified by the number "30". See the column in FIG. 7 designated "Coefficient Address". The repetitive group of "31" numbered clock pulses are referred to collectively as a pulse train.

The coefficient selection means 50 accomplishes this individual numbering and grouping of pulses into repetitive trains. Coefficient selection means 50 includes address counter 20, ROM 14 and And gates 16 and 18. Address counter 20 begins with a count of "0" and counts upward until a count of "30" is reached. And gate 16 detects the count of "30" from address counter 20 and generates an output signal indicated by the triangular box containing the number "30". The output of And gate 16 is coupled to the reset input of address counter 20. A count of "30" is sensed by And gate 16 which generates an output signal causing address counter 20 to reset itself to a count of "0". This feed back between And gate 16 and address counter 20 provides a pulse grouping signal which groups the clock pulses into pulse sequences or trains composed of repetitive series of individually numbered pulses. The address counter 20 numbers each pulse in a train. And gate 16 terminates the series of numbered pulses after a train of "31" pulses has been generated.

As address counter 20 counts from "0" to "30" its output which is coupled to the address input of ROM 14 addresses the various stored filter coefficients. As each of the stored filter coefficients is addressed, ROM 14 generates a corresponding coefficient output signal which is coupled to the input of multiplier 12.

Clock 22, address counter 20, and sequence counter 106 provide all of the control signals that are necessary to operate the filter. To satisfy the Nyquist criterion, clock 22 must operate at a rate "30" times higher than the sampling rate. For convenience clock 22 is operated at a rate "31" times higher than the sampling rate (248 kHz) to achieve an 8 kHz overall sampling rate. The extra or 31st pulse in a train is used to read out a filtered digital output pulse before the digital filter accepts a new input sample of the X(t) input function.

During the first pulse in a train And gate 18 detects the count of "0" from address counter 20 and gates in a new input sample of X(t) through Analog-to-Digital (A/D) converter 2 and select gate 4. The number of bits of accuracy required for A/D converter 2 is determined by each application, but "12" bits is a frequently used accuracy.

At the end of each pulse train of "31" pulses And gate 16 detects a count of "30" in address counter 20 and generates a pulse grouping signal which causes the following to occur:

Address counter 20 is reset to 0;

Sequence counter 106 is reset to 0;

Adder 108 right hand input value is set to 3;

Index register 110 accepts its own output count which has been fed back through adder 108 and is thereby incremented by 3; and D/A converter 26 converts its current input signal into an analog voltage.

The output from coefficient selection means 50 is combined with the output of variable store means 100 by processor means 60 to generate the filtered digital output signal which is converted to a filtered analog output signal by D/A converter 26. Processor means 60 includes multiplier 12, adder 8, accumulator 6, select gate 4, and word And gate 10. And gate 18 generates an output signal when it detects a "0" output state of address counter 20. This "0" detect output pulse from And gate 18 causes A/D converter 2 to generate a digital input pulse from the X(t) analog input signal. This digital signal from And gate 18 also activates select gate 4 causing it to route the newly sampled input pulse to RAM 102 where it is loaded and stored. For the remaining "30" pulses of each sampling period select gate 4 selects the output of accumulator register 6 for input to adder 8.

Word And gate 10 performs a bit by bit "and" or conjunction operation on the input to adder 8. This conjunctive function causes the input to adder 8 to be forced to the all "0" state in response to the control signal from And gate 112. This control signal from And gate 112 is generated during a sequence counter output of "0" and corresponds to the loading of a new variable input value into RAM 102. The first timing pulse during a sampling interval will correspond to a sequence counter output of "0" and will cause a newly sampled input pulse to be gated into RAM 102. All other sequence counts of "0" during the remaining pulses of each pulse train will cause the contents of accumulator register 6 to be loaded into RAM 102. Additionally, whenever And gate 112 detects a sequence counter output of "0", word And gate 10 will force a "0" into the right hand input of adder 8 such that the new output from multiplier 12 will be loaded directly into accumulator register 6. This corresponds to the calculation of the first term in each of the difference equations previously described.

Be referring now to FIGS. 6 and 7, an actual operational sequence of the cascaded recursive digital filter will be discussed. The vertical column in FIG. 7 labeled "Coefficient Address" runs between "0" and "30" and corresponds to the "31" numbered timing pulses within a particular pulse group or pulse train. The coefficient address signals are generated by address counter 20 and select one of the "30" fixed filter coefficients from ROM 14. The content or filter coefficient in the 31st horizontal row has a value of "0" since the 31st timing pulse in a pulse train is used to read out the filtered digital output pulse from the filter.

FIG. 7 indicates the sequence counter, index register, RAM address and RAM contents during the sampling periods or sampling intervals where N=3, 4, and 5. The sequence or period where N=3 will now be discussed. The output of the sequence counter is stepped from "0" to "4" once each time a different difference equation is executed. The index counter is incremented by "2" each time the count of the sequence counter reaches "4". For any given timing pulse adding the value of the sequence counter output to the index register output will yield the address of RAM 102. As an example, a coefficient address of "4" will equal a RAM address of "4" (4 + 0=4). Similarly, a coefficient address of "18" will generate a RAM address of "9" (3 + 6=9). Between coefficient address "30" where the RAM address is "12" and coefficient address "0" in the period where N=4, index register 110 has been incremented by "3" instead of the typical "2". This increment of "3" is caused by the output of And gate 16 activating adder 108 which feeds back the output value from index register 110 and increases its value by "3".

Difference equation 1 is implemented in the following manner: During coefficient address "0", ROM contents A(1,0) are multiplied by the new input value shown as RAM content X(3) is RAM address "0". This value is loaded into accumulator register 6. During other subsequent sequence counts the output of the multiplier 12 will be added to the contents of accumulator register 6 instead of being loaded directly into accumulator register 6. Clock 22 then advances the coefficient address to "1" and the sequence count to "1" such that coefficient A(1,1) will be multiplied by the previous input pulse X(2) and added to the preexisting content of accumulator register 6. In a similar manner A(1,2) will be multiplied by X(1) and added, and B(1,1) will be multiplied by Y(1,2) and added, and B(1,2) will be multiplied by Y(1,1) and added. These five multiplication operations will all be accumulated in accumulator register 6 and correspond to the Y(1,3) output indicated in FIG. 5 as the output of filter section 1 when N=3. The output pulse from And gate 16 at an address counter output of "30" will cause D/A converter 26 to generate an analog equivalent of the Y(6,3) filtered digital output pulse.

Beginning with coefficient address "5" the index register count will be incremented to a value of "2" and the previously computed value of Y(1,3) will be stored in RAM 102 storage address "2" and will be multiplied by A(2,0) and loaded into accumulator register 6. This sequence of events will continue until coefficient address "29" when B(6,2) is multiplied by Y(6,1) and added to accumulator register 6 to generate the final digital filter output pulse Y(6,3). The 31st clock cycle in each pulse train is used to generate coefficient address "30" which will result in a new output being stored in RAM 102 address "12". At the next clock cycle the index register will be incremented to a new value of "15". The coefficient address will be reset to "0" and a new analog input will be gated in through A/D converter 2 and through select gate 4 into RAM 102 location "15". This event commences the next sampling period or sequence.

Specific numerical values for the thirty filter coefficients listed under the heading "ROM CONTENTS" of FIG. 7 have not been included in FIG. 7 since a different set of values would be required for each desired filter transfer function. Table I below discloses values for each of the filter coefficients for a cascaded recursive digital filter consisting of a cascade of six filters. The numerical filter values listed below will provide a filter having a low pass band filter characteristic. Different sets of numerical coefficients can be derived by those skilled in the art by utilizing well known techniques to provide various other types of filter characteristics.

TABLE I

| FILTER COEFFICIENTS | NUMERICAL VALUE |
|---|---|
| $A_{10}, A_{30}, A_{50}$ | .218 |
| $A_{11}, A_{31}, A_{51}$ | .437 |
| $A_{12}, A_{32}, A_{52}$ | .218 |
| $A_{20}, A_{40}, A_{60}$ | .456 |
| $A_{21}, A_{41}, A_{61}$ | .911 |
| $A_{22}, A_{42}, A_{62}$ | .456 |
| $B_{11}, B_{31}, B_{51}$ | −1.585 |
| $B_{12}, B_{32}, B_{52}$ | − .863 |
| $B_{21}, B_{41}, B_{61}$ | − .727 |
| $B_{22}, B_{42}, B_{62}$ | − .307 |

It will be apparent to those skilled in the art that the disclosed cascaded recursive digital filter may be modified in numerous other ways and may assume many embodiments other than the preferred form specifically set out and described above. One highly advantageous alteration would include using a RAM in place of ROM 14. This RAM would be coupled to operate in a manner very similar to RAM 102 in variable store means 100 to alter the filter coefficients as required to reduce interference from electromagnetic jamming. Accordingly, it is intended by the appended claims to cover all such modifications of the invention which fall within the true spirit and scope of the invention.

What is claimed is:

1. A cascaded digital recursive filter for filtering digital input pulses from a time varying digital input signal by repetitively implementing a sequence of filter equations which include a predetermined number of filter coefficients to generate a filtered digital output signal comprising a series of filtered digital output pulses, said filter comprising in combination:
 (a) timing means for generating a series of timing pulses;
 (b) coefficient selection means including storage means containing stored filter coefficients, said coefficient selection means being responsive to the timing pulses from said timing means for generating a pulse grouping signal, for grouping the timing pulses into repetitive trains of individually numbered pulses, and for reading out on a coefficient output line a repetitive series of stored filter coefficients, each of said stored filter coefficients being associated with one of the individualy numbered pulses in each of said trains of pulses;
 (c) processor means;
 (d) variable store means coupled to said processor means and responsive to the timing pulses and to the pulse grouping signal for selectively storing variables generated by said processor means and for generating a partially repetitive series of variables on a variable output line; and
 (e) said processor means coupled to the coefficient output line of said coefficient selection means and to the variable output line of said variable store means and responsive to the digital input signal and to the pulse grouping signal for combining selected stored filter coefficients, selected variables and the digital input signal to generate one filtered digital output pulse at the end of each train of individually numbered pulses, said processor means further including a select gate for transferring a new digital input pulse to said variable store means during the first individually numbered pulse in each train.

2. The filter according to claim 1 wherein said coefficient selection means further includes a read only memory for reading out the stored filter coefficients.

3. The filter according to claim 1 wherein said variable store means includes a random access memory for storing and reading out the partially repetitive series of variables on the variable output line.

4. The filter according to claim 1 wherein said coefficient selection means further includes an address counter for generating the pulse grouping signal.

5. The filter according to claim 1 wherein said processor means further includes a multiplier for combining selected stored filter coefficients and selected variables.

6. The filter according to claim 5 wherein said coefficient selection means further includes a read only memory for reading out the stored filter coefficients.

7. The filter according to claim 6 wherein said variable store means includes a random access memory for storing and reading out the partially repetitive series of variables on the variable output line.

8. The filter according to claim 7 wherein said coefficient selection means further includes an address counter for generating the pulse grouping signal.

9. The filter according to claim 8 wherein said processor means further includes a select gate for transferring a new digital input pulse to said variable store means during the first individual numbered pulse in each train.

10. A cascaded digital recursive filter for filtering digital input pulses from a time varying digital input signal by repetitively implementing a sequence of filter equations which include a predetermined number of filter coefficients to generate a filtered digital output signal comprising a series of filtered digital output pulses, said filter comprising in combination:

(a) timing means for generating a series of timing pulses;
(b) coefficient selecting means including
   i. an address counter coupled to said timing means for generating a pulse grouping signal;
   ii. a read only memory containing stored filter coefficients;
   iii. a coefficient output line;
   iv. said coefficient selection means being responsive to the pulse grouping signal for grouping the timing pulses into repetitive trains for individually numbered pulses and for reading out on said coefficient output line repeating series of said stored filter coefficients, each of said stored filter coefficients being associated with one of the individually numbered pulses in each of said trains of pulses;
(c) processor means for generating variables;
(d) variable store means including a random access memory and coupled to said timing means, said processor means, and said coefficient selection means for storing selected variables generated by said processor means and for generating a partially repetitive series of variables on a variable output line; and
(e) said processor means including a multiplier and coupled to the coefficient output line of said coefficient selection means and to the variable output line of said variable store means and responsive to the digital input signal and to the pulse grouping signal for combining selected stored filter coefficients, selected variables and the digital input signal to generate one filtered digital output pulse at the end of each train of individually numbered pulses, said processor means further including a select gate for transferring a new digital input pulse to said variable store means during the first individually numbered pulse in each train.

* * * * *